United States Patent [19]

Faust

[11] 4,019,972
[45] Apr. 26, 1977

[54] PHOTOPOLYMERIZABLE COPYING COMPOSITIONS CONTAINING BIURET-BASED POLYFUNCTIONAL MONOMERS

[75] Inventor: Raimund Josef Faust, Wiesbaden-Biebrich, Germany

[73] Assignee: Hoechst Aktiengesellschaft, Germany

[22] Filed: Dec. 2, 1974

[21] Appl. No.: 528,836

[30] Foreign Application Priority Data

Dec. 7, 1973   Germany ............... 2361041

[52] U.S. Cl. ............... 204/159.15; 96/35.1; 96/36; 96/36.2; 96/36.3; 96/115 P; 204/159.16; 204/159.19; 204/159.14; 260/77.5 CR; 260/859 R; 260/881; 260/884; 260/885; 260/886; 427/54; 428/425; 428/457; 428/474
[51] Int. Cl.² ............... C08F 8/00; C08G 18/00
[58] Field of Search ............... 204/159.15, 159.16, 204/159.19, 159.23, 159.24; 96/115 P, 115 R, 35.1, 36, 36.2

[56] References Cited
UNITED STATES PATENTS

| | | | |
|---|---|---|---|
| 3,673,140 | 6/1972 | Ackerman et al. | 260/22 TN |
| 3,751,259 | 8/1973 | Bauer et al. | 96/115 P |
| 3,759,809 | 9/1973 | Carlick et al. | 204/159.23 |
| 3,804,631 | 4/1974 | Faust | 96/115 P |
| 3,840,369 | 10/1974 | Carlick et al. | 96/33 |
| 3,850,770 | 11/1974 | Juna et al. | 204/159.19 |
| 3,878,077 | 4/1975 | Borden et al. | 204/159.76 |

*Primary Examiner*—Richard B. Turer
*Attorney, Agent, or Firm*—James E. Bryan

[57] ABSTRACT

This invention relates to a photopolymerizable copying composition comprising at least one binder, at least one photoinitiator, and at least one polymerizable, acid amide group-containing acrylic acid derivative or alkyl acrylic acid derivative which is not volatile at 100° C and contains at least two polymerizable groups in the molecule, the polymerizable compound containing at least one compound of the following general formula $$A(-X-NH-CO-G)_p$$

wherein:
A stands for $Z(-CO-NH-)_2$ wherein

Z is

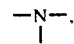

$-O-CH_2-C_qH_{2q}-O-$, or $-O-(CH_2CH_2-O-)_r$, wherein
$q$ is a whole number from 1 to 11, and
$r$ is a whole number from 1 to 5, or for $$E-C(-CH_2-O-CO-NH-)_3$$

wherein

E is $CH_3-$, $C_2H_5-$ or $-NH-CO-O-CH_2-$,
G stands for

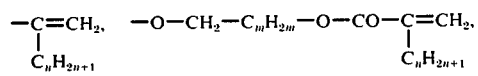

or

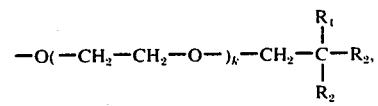

wherein
$n$ is 0, 1, or 2,
$m$ is a whole number from 1 to 11,
$k$ is 0 or a whole number from 1 to 4,
$R_1$ is alkyl with 1 to 3 carbon atoms, or $-R_4$ or $-CH_2-R_4$,
$R_2$ and $R_3$, which may be the same or different, are $-H$, $-CH_3$, or $-CH_2R_4$, and
$R_4$ is

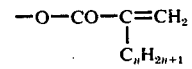

and is present in at least one of the groups $R_1$, $R_2$, and $R_3$,
X stands for a saturated or unsaturated bivalent hydrocarbon group with 2 to 12 carbon atoms, and
$p$ is a whole number from 2 to 4.

12 Claims, No Drawings

PHOTOPOLYMERIZABLE COPYING COMPOSITIONS CONTAINING BIURET-BASED POLYFUNCTIONAL MONOMERS

This invention relates to a novel photopolymerizable copying composition which may be in the form of a liquid or of a solid layer on a support, and which comprises, as the essential components, at least one binder, at least one polymerizable compound, and at least one photoinitiator.

Photopolymerizable compositions and copying materials, such as those used today in the reproduction field, contain photopolymerizable compounds, especially esters of acrylic or metharcrylic acid with polyhydric aliphatic alcohols. The following monomers are exemplary:

Hexanediol-(1,6)-diacrylate, triethyleneglycol diacrylate, polyethyleneglycol diacrylate, neopentylglycol diacrylate, diglycerol diacrylate, trimethylol ethane triacrylate, trimethylol propane triacrylate, pentaerythritol tetraacrylate, and dipentaerythritol hexaacrylate, and the corresponding methacrylates.

These known monomers either have an annoyingly high volatility, such as triethylene glycol diacrylate, trimethylol ethane triacrylate, or trimethylol propane triacrylate, or they are solid (crystalline) at room temperature, such as pentaerythritol tetraacrylate, so that they crystallize from the photopolymer layer, thus causing a number of known drawbacks. Moreover, many of the above-mentioned monomers and other, less volatile monomers, such as pentaerythritol triacrylate or polyethyleneglycol diacrylate, possess sufficient adhesion only on specially modified metal supports, for example on specifically roughened and possibly eloxated aluminum, and are completely useless on other supports because of their insufficient adhesion.

This drawback is particularly evident in the case of copper supports, especially when it is attempted to produce layers capable of aqueous-alkaline development by selecting binders containing carboxyl groups. In addition to their insufficient adhesion to metal layers that are not specifically pre-treated, the above-mentioned monomers have the disadvantage that they cannot be processed into sufficiently flexible, nonadhesive photopolymer layers with the conventional alkaline-developing binders hitherto used.

Other monomers, such as those containing urethane groups which are described in German Offenlegungsschrift No. 2,064,079, display a very good adhesion to unmodified metal surfaces, but in combination with customary binders, they form layers which are too soft and have an annoying cold flow tendency. Other photopolymerizable systems containing urethane structures, e.g. the acrylate or methacrylate group-containing polymers described in German Offenlegungsschrift No. 2,121,253, have polymeric characteristics and thus are solids of low solubility. Thus, they do not lend themselves to a purely aqueous-alkaline development, even if combined with binders containing carboxyl groups. Still other monomer systems containing additional hydrophilic groups in the form of at least 5 polyether groups, which are described in German Offenlegungsschrift No. 2,115,373, may be used for the production of letter press printing plates, but are not sufficiently resistant to aqueous-alkaline developers when they are disposed on metals as a thin layer, for use as resist materials or planographic printing plates.

It is an object of the present invention to provide a photopolymerizable copying composition from which flexible copying layers may be prepared which are nonadhesive at room temperature, can be developed with aqueous-alkaline solutions, and display only negligible cold flow.

The invention is based on a photopolymerizable copying composition which comprises, as the essential components, at least one binder, at least one photoinitiator, and at least one polymerizable, acid amide group-containing acrylic acid derivative or alkyl acrylic acid derivative which is not volatile at 100° C and contains at least two polymerizable groups in the molecule.

In the copying composition according to the invention, the polymerizable compound contains at least one compound of the following general formula $$A(-X-NH-CO-G)_n$$

wherein:

A stands for $Z(CO-NH-)_2$ wherein

Z is $-\overset{|}{N}-$, $-O-CH_2-C_qH_{2q}-O-$, or $-O-(CH_2CH_2-O-)_r$
wherein
  $q$ is a whole number from 1 to 11, and
  $r$ is a whole number from 1 to 5, or for $$E-C(-CH_2-O-CO-NH-)_3$$

wherein
  E is $CH_3-$, $C_2H_5-$ or $-NH-CO-O-CH_2-$,
  G stands for

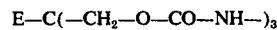

$-\underset{C_nH_{2n+1}}{\overset{|}{C}}=CH_2$, $\quad -O-CH_2-C_mH_{2m}-O-CO-\underset{C_nH_{2n+1}}{\overset{|}{C}}=CH_2$, or

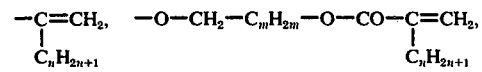

$$-O(-CH_2-CH_2-O-)_k-CH_2-\underset{R_3}{\overset{R_1}{\underset{|}{\overset{|}{C}}}}-R_2$$

wherein
  $n$ is 0, (5)1 or 2,
  $m$ is a whole number from 1 to 11,
  $k$ is 0 or a whole number from 1 to 4,
  $R_1$ is alkyl with 1 to 3 carbon atoms, or $-R_4$ or $-CH_2-R_4$, $R_2$ and $R_3$, which may be the same or different, are $-H$, $-CH_3$, or $-CH_2R_4$, and
  $R_4$ is

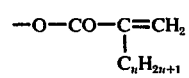

$$-O-CO-\underset{C_nH_{2n+1}}{\overset{|}{C}}=CH_2$$

and is present in at least one of the groups $R_1$, $R_2$, and $R_3$,

X stands for a saturated or unsaturated bivalent hydrocarbon group with 2 to 12 carbon atoms, and $p$ is a whole number from 2 to 4.

Advantageously, the polymerizable compounds according to the invention comprise at least two urethane groups and preferably an additional biuret group in the molecule. The urethane groups are preferably formed with a group G which contains oxygen. Preferably, the polymerizable groups are methacrylic acid groups, which means that $n$ preferably is 1.

Instead of urethane groups, the polymerizable compounds according to the invention may contain acid amide groups, i.e. groups in which G stands for the group

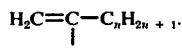

Generally, compounds of this type have higher melting points and thus are more likely to crystallize. Therefore, they preferably are used in combination with a liquid monomer, which may be either a known monomer or one according to the present invention. Compounds in which G contains at least one oxygen atom and forms an urethane group with the carbonamide group of the general formula are preferred.

Generally, the compounds according to the present invention have molecular weights ranging from 300 to 10,000, preferably between 600 and 2,000. Their viscosities at a temperature of 50° C normally are in the range from 5 to 10,000 poises, preferably from 10 to 2,500 poises. As already mentioned, A preferably stands for the

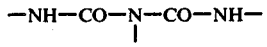

group in the above formula.

The group X may be a saturated or unsaturated, bivalent, aliphatic, cycloaliphatic or aromatic hydrocarbon group. Aliphatic and cycloaliphatic, as also mixed aliphatic/cycloaliphatic groups having from 2 to 12 carbon atoms, preferably from 4 to 12 carbon atoms, are preferred.

Compounds in which X stands for a group containing at least one, preferably more, lateral methyl groups yield copying compositions which are distinguished by their particularly good adhesion to metals, especially to copper.

The preferred polymerizable compounds containing a biuret group are prepared as follows:

Diisocyanates of the formula OCN—X—NCO are reacted in known manner with a calculated amount of water to yield triisocyanates containing biuret groups (cf. Houben-Weyl "Methoden der organischen Chemie," 4th Edition, 1963, Georg Thieme Verlag, Stuttgart, Vol. 14/2, pages 69 et seq., and German Patent No. 1,101,394). Analogously to the process described in German Offenlegungsschrift No. 2,064,079, the triisocyanates are then reacted with acrylic acid esters or alkyl acrylic acid esters containing free OH groups.

The diisocyanates used as the starting materials are either known or may be prepared by analogy to known compounds. The following compounds are exemplary: ethylene diisocyanate, propylene diisocyanate, butylene-1,3-diisocyanate, hexamethylene diisocyanate, 2,2,4-trimethyl-hexamethylene diisocyanate, 2,4-dimethyl-6-ethyloctamethylene diisocyanate, cyclohexylene diisocyanate, cyclopentylene diisocyanate, 1,4-diisocyanatomethyl-cyclohexane, 1,3-diisocyanato ethyl cyclohexane, toluylene diisocyanate, 3,3,5-trimethyl-1-isocyanato-5-isocyanatomethyl cyclohexane, and 2-butene-1,4-diisocyanate.

The reaction between diisocyanate and water takes place at a temperature in the range of about 70° to 150° C. The resulting biuret compound is reacted in benzene or toluene with esters containing OH groups, with the addition of catalytic quantities of a tertiary amine and a thermal stabilizer, e.g. benzoquinone, to produce the triurethane.

Hydroxyethyl methacrylate and hydroxypropyl methacrylate ($n$ or iso compounds) and the corresponding acrylates are preferably used as the OH group-containing esters, because they are the simplest representatives of this group of compounds.

The following compounds also may be used with advantage, however: 2-hydroxy-butyl methacrylate, 4-hydroxy-butylmethacrylate, 2-hydroxy-cyclohexyl methacrylate, and other hydroxy alkyl methacrylates containing up to 12, preferably up to 6 carbon atoms in their alkyl residues; further diethylene glycol monomethacrylate, triethylene glycol monomethacrylate, and other polyethylene glycol monomethacrylates containing up to 5 oxyethylene units; trimethylol ethane-dimethacrylate, trimethylol propane dimethacrylate, pentaerythritol trimethacrylate, and the reaction products of these branched multi-valent esters with up to 4 moles of alkylene oxide, especially ethylene oxide, known from German Auslegeschrift No. 1,267,547, further the corresponding acrylates. If the copying compositions according to the present invention are to be used as resist layers on copper supports, the adhesion of the methacrylates is normally better than that of the acrylates.

Other members of the group of monomers used in the copying composition according to the invention are prepared by partial reaction of diisocyanates with bi- to tetra-valent, preferably trivalent, alcohols containing primary OH groups, followed by a reaction of the excess isocyanate groups with OH group-containing acrylates or alkylacrylates. The above-mentioned compounds may be used as diisocyanates. If diisocyanates are used in which the two isocyanate groups differ in their reactivity, e.g. 3,3,5-trimethyl-1-isocyanato-5-isocyanatomethyl-cyclohexane, products are obtained which are substantially uniform. On the other hand, if the diisocyanates used contain two similar isocyanate groups, non-uniform products are obtained which, in addition to the expected compounds of the simplest structure, also contain polyaddition products of relatively high molecular weight. These products also may be used for the copying compositions according to the invention, provided they are liquid-viscous at normal room temperature and possess a viscosity between 10 and 10,000 pieces at a temperature of 50° C. Solid products are unsuitable for use as the only monomers contained in the copying composition, because even in combination with appropriate binders, it is very difficult in this case to achieve a satisfactory developing speed in a purely aqueous-alkaline medium and, at the same time, an adequate resistance to developer solutions. At best, solid compounds may be used together with liquid-viscous monomers in the copying compositions of the invention. Examples of solid monomers are the reaction products of the above-described, biuret group containing triisocyanates with unsaturated acids, preferably acrylic acid or methacrylic acid. Products prepared by a partial reaction of diisocyanates with aliphatic polyethers containing OH groups and subsequent reaction of the unreacted isocyanate groups with acrylates or methacrylates containing OH groups also may be used with advantage as compounds suitable for such combinations.

By using polyethers containing 5 or more ether groups per molecule in the preparation of the polymerizable monomers, the developing characteristics of the compounds may be improved, but in this case the adhesion of the resulting compounds on metallic supports, especially copper, decreases.

The reaction of the isocyanates with the acrylates and alkylacrylates containing OH groups is advantageously performed in an inert solvent, such as benzene or toluene, and in the presence of a tertiary amine acting as a catalyst. For the thermal stabilization of the products, which have a strong polymerizing tendency, quinones, preferably benzoquinone, are added in concentrations between 0.01 and 2 percent by weight.

Due to the highly viscous photopolymerizable monomers having urethane and/or biuret groups contained therein, the copying compositions according to the present invention yield layers which are distinguished by their nonadhesiveness, non-volatility, resistance to handling, and flexibility. Other than in the case of hitherto known photoresist compositions, the flexibility of the copying layers of the present invention after exposure is not associated with excessive softness and cold-flow of the unexposed layer. As a particularly advantageous feature, it has been noted that the copying compositions according to the invention have a very good adhesion to metal supports which have not been specially pre-treated, e.g. copper supports, and due to their low cold-flow, possess adequate dimensional stability, which becomes particularly apparent when large dry resist rolls prepared with these copying compositions are stored or when bored circuit boards are laminated on both sides.

When the copying compositions according to the invention are used as photoresist material or as dry resist films for the preparation of etch resist or electro resist masks — for which purposes they are preferred — the light-hardened resists are distinguished by an excellent resistance to etching and very good adhesion to the usual support materials. The good adhesion is particularly important in the case of copper surfaces, such as those used in the production of printed circuits, letterpress printing forms, multi-metal printing plates and the like, because with these materials the adhesion of photopolymer layers and in particular copying layers capable of being developed with aqueous-alkaline solutions, presented special problems in the past. The adhesion of the inventive layers to other metal supports, such as chromium, brass, zinc or steel, also is very good.

When the etch resists produced from the copying compositions according to the invention are undercut, resistant, flexible resist kerns are produced which are not broken during spraying with the etching solution, even if relatively high pressure is applied.

The flexibility of the copying layer is of advantage not only during the etching step, but also for other purposes, for example in the preparation of offset and letterpress printing forms, because a brittle layer tends to form hairline cracks when the printing form is bent.

The copying composition according to the invention may be marketed in known manner in the form of a solution or dispersion which is used by the customer for the preparation of etch resist layers. Preferably, however, the copying compositions according to the invention are used for the preparation of dry resist films composed of an intermediate support, e.g. a transparent plastic film, with a ready-to-use photoresist layer disposed thereon. Such dry resist films are laminated by the customer to the surface which is to be etched or electrotyped image-wise and are then exposed and developed in situ, the intermediate support being removed before development.

The copying composition according to the invention is particularly suitable for these modes of application. Alternatively, it may be mass-produced in the form of a layer disposed on a suitable support, e.g. aluminum or zinc, as a presensitized copying material, from which offset or relief printing forms may be produced by photomechanical means. Further, the copying composition according to the invention may be used for the preparation of relief images, screen printing stencils, color proofing foils and the like.

In addition to monomers, photoinitiators, and binders, the copying composition according to the invention may contain various other customary additives, such as inhibitors to reduce the thermal polymerization of the copying composition, hydrogen donors, sensitometric agents, dyestuffs, colored and uncolored pigments, color couplers, and indicators.

Advantageously, these components should be so selected that they do not unduly absorb within the actinic wave length range of importance for the initiating process.

A number of substances may be used as photoinitiators in the copying compositions according to the invention, for example: benzoin, benzoin ether, multinuclear quinones, such as 2-ethyl-anthraquinone, acridine derivatives, such as 9-phenyl-acridine, 9-p-methoxy-phenylacridine, 9-acetylamino-acridine, or benz(a)-acridine; phenazine derivatives such as 9,10-dimethyl-benz(a)-phenazine, 9-methylbenz(a)-phenanzine, or 10-methoxy-benz(a)-phenazine; quinoxaline derivatives, such as 6,4',4''-trimethoxy-2,3-diphenyl-quinoxaline, or 4',4''-dimethoxy-2,3-diphenyl-5-aza-quinoxaline; quinazoline derivatives, and the like.

A great number of soluble organic polymers may be used as binders. Suitable compounds are, for example: polyamides, polyvinyl esters, polyvinyl acetals, polyvinyl ethers, polyacrylic acid esters, polymethacrylic acid esters, polyesters, alkyd resins, polyacrylamide, polyvinyl alcohol, polyethylene oxide, polydimethylacrylamide, polyvinyl pyrrolidone, polyvinyl methyl formamide, polyvinyl methyl acetamide, and copolymers of the monomers from which the above listed homopolymers are formed.

Futhermore, natural substances and modified natural substances, such as gelatin, cellulose ethers and the like, may be used as binders.

Advantageously, the binders used are soluble or at least swellable in aqueous-alkaline solutions, because layers containing such binders are capable of being developed with the preferred aqueous-alkaline developers. Binders of this type may contain, for example, the following groups: —COOH, —PO$_3$H$_2$, —SO$_3$H, —SO$_2$NH$_2$, —SO$_2$—NH—CO—, and the like. Examples of such binders are: maleinate resins, polymers of N-(p-tolylsulfonyl)-carbamic acid-($\alpha$methacryloyloxyethyl)-ester, and copolymers of these and similar monomers with other monomers, styrene-maleic acid-anhydride copolymers and methylmethacrylate-methacrylic acid copolymers. Preferably, copolymers of methacrylic acid, alkylmethacrylates and methyl methacrylate and/or styrene, acrylonitrile, and the like, described in German Offenlegungsschriften Nos. 2,064,080 and 2,363,806, are used.

Other photopolymerizable monomers may be added in small quantities to the copying compositions according to the invention with the proviso, however, that they must not substantially detract from the above-described advantages resulting from the use of the monomers of the present invention in the photopolymerizable composition.

Light-sensitive materials are produced in known manner from the copying composition according to the invention. Thus, it is possible to dissolve or disperse the copying composition in a solvent and apply the resulting solution or dispersion to the selected support by casting, spraying, immersion, roller application, and the like, the resulting film being finally dried. Relatively thick layers (of 250 $\mu$ and more, for example) also may be produced by extrusion or molding, and the resulting self-supporting films are then laminated to the support.

Suitable supports for the layers produced from the copying compositions according to the invention are metals, such as aluminum, zinc, copper, steel, chromium, brass, and other metal alloys; further, the supports used for screen printing stencils, such as nickel or perlon gauze; and finally plastic films, the plastic films, and among these especially the polyester films, being subjected to a special surface treatment, if necessary.

The copying layers thus produced are exposed and developed in known manner. Suitable developers are aqueous, preferably aqueous-alkaline solutions, e.g. alkali phosphate or alkali silicate solutions to which small quantities of miscible organic solvents and wetting agents may be added, if desired. It is also possible to use organic solvents or mixtures of organic solvents as developers.

As already mentioned, the copying compositions according to the invention may be used for a wide variety of applications. They are used with particular advantage for the preparation of photoresist or etch resist layers on metal supports, however. They are particularly suitable for application to copper supports. In these preferred embodiments, the excellent adhesion of the exposed areas of the layer was found to be of advantage not only during development, but also during subsequent etching of the support, where the layers display a good etching resistance when appropriate binders are used.

As already mentioned, the copying compositions may be used and handled with particular advantage in the form of so-called dry resist materials, because even the dry layers may be easily transferred onto metal supports and have a good adhesion. In this case, polyester films are particularly suitable for use as transparent intermediate supports.

In the following examples, individual embodiments of the copying composition according to the invention are illustrated. Unless otherwise stated, percentages and proportions are by weight. One part by weight is 1 gram when the unit per volume is 1 milliliter.

EXAMPLE 1

A solution of
  6.4 parts by weight of a copolymer of
    175 parts by weight of 2-ethyl-hexyl methacrylate,
    30 parts by weight of acrylonitrile,
    20 parts by weight of ethyl acrylate, and
    95 parts by weight of methacrylic acid,
  0.15 part by weight of triethylene glycol dimethacrylate,
  0.20 part by weight of 9-phenyl-acridine,
  0.015 part by weight of Michler's ketone,
  0.065 part by weight of a blue azo dyestuff produced by coupling 2,4-dinitro-6-chloro-benzene diazonium salt with 2-methoxy-5-acetylamino-N-cyanoethyl-N-hydroxyethyl-aniline, and
  5.6 parts by weight of the monomer described below in
  20.0 parts by weight of ethyleneglycol monoethyl ether, and
  10.0 parts by weight of methyl ethyl ketone is whirler-coated onto a 25 $\mu$ thick, biaxially stretched polyethyleneterephthalate film in a manner such that, after drying at 100° C, a layer weighing 13.4 grams per square meter results.

The dry resist film thus produced is laminated, by means of a laminating device of type 9 LD manufactured by General Binding Corp., USA, at about 130° C onto a phenoplast laminate to which a 35 $\mu$ thick copper foil had been applied. The plate is then exposed for 20 seconds in a xenon copying apparatus (type Bikop, model Z, 8 kilowatts) manufactured by Klimsch & Co., Frankfurt/Main, Germany, the distance between the lamp and the printing frame being 80 cm. A screen test plate marketed by Messrs. Heidenhain, Traunreut, Germany, and having lines of a width from 4 mm down to 5 $\mu$ is used as the original. The exposed copying layer is developed with a solution of a pH value of 11.3 which has the following composition:
  1,000 parts by weight of water,
  15.0 parts by weight of sodium metasilicate nonahydrate,
  3.0 parts by weight of "Polyglycol 6,000,"
  0.3 part by weight of levulinic acid, and
  0.3 part by weight of strontium hydroxide octahydrate.

The plate is wiped with the developer for 1.5 minutes and then rinsed with water. Down to a width of 50 $\mu$, resist lines of the same dimensions as the lines in the original are thus produced. The resist may be used as an etch resist for iron-III-chloride solutions or as an electro resist for the conventional electroplating baths (cf. Example 14).

The monomer used in this example (M I) is prepared as follows:

At a temperature between 97° and 99° C and while stirring, 6 grams of water are added drop by drop, over a period of 6 hours, to 168 grams of hexamethylene diisocyanate, using a carefully dried three-necked 1 liter flask equipped with a reflux condenser, a calcium chloride drying tube, a stirrer, and a dropping funnel. The temperature is then raised to 130° – 140° C and after three hours the mass is cooled. The biuret group-containing triisocyanate thus produced is a substantially clear, weakly yellow colored viscous oil with an isocyanate content of 27.4 percent by weight (see German Patent No. 1,101,394).

80 g of the triisocyanate thus produced are dissolved in 500 ml of anhydrous benzene, using a three-necked 1-liter flask with a reflux condenser, a drying tube, and a stirrer attached to it. After adding 65 g (0.5 mole) of hydroxyethyl methacrylate, 1.0 g of freshly purified benzoquinone as a thermal stabilizer, and 0.5 g of N,N-diethylcyclohexylamine as a reaction accelerator, the mixture is boiled for 4 hours with reflux. After the mass has cooled, 1.49 g of hydroquinone monomethyl ether are added for further stabilization and the solvent is removed by vacuum distillation at 50° C. A highly viscous oil of the structural formula (M I) shown in the table below is obtained.

$C_{41}H_{68}N_6O_{14}$ (M = 869.0).

Propenyl-(2) group content: calculated: 14.2; found: 11.1. N content: calculated: 9.68; found: 9.78.

EXAMPLE 2

The procedure described in Example 1 is repeated, except that the monomer used in Example 1 is replaced by the same quantity of a monomer (M II) which is prepared as follows:

In a carefully dried three-necked 1-liter flask equipped with reflux condenser, calcium chloride tube, stirrer and dropping funnel, 6 g of water are added drop by drop, over a period of 6 hours and while stirring, to 210 g of 2,2,4-trimethyl-hexamethylene diisocyanate at a temperature between 97° and 99° C. The temperature is then raised to 130° – 140° C and after 3 hours the mass is cooled. The biuret group-containing triisocyanate thus obtained is a clear, weakly yellow colored viscous oil which has an isocyanate content of 21 percent by weight.

101 g of the triisocyanate thus produced are dissolved in 500 ml of anhydrous benzene in a three-necked 1-liter flask equipped with stirrer, reflux condenser and drying tube. After adding 72 g of hydroxypropyl methacrylate (0.5 mole), 1.0 g of freshly purified benzoquinone as a thermal stabilizer, and 0.5 g of diethylcyclohexylamine as a reaction accelerator, the mixture is boiled for four hours with reflux. After cooling, 1.73 g of hydroquinone monomethyl ether are added for further stabilization and the solvent is distilled off under reduced pressure at 50° C. A highly viscous oil of the structure (M II) shown in the table below is obtained.

$C_{53}H_{92}N_6O_{14}$ (M = 1037.3).

Propenyl-(2) content: calculated: 11.0; found: 10.0. N content: calculated: 8.1; found: 8.0.

The coating solution prepared with this monomer is whirler-coated onto a polyester film as described in Example 1 and then dried such that a layer weighing 18.9 grams per square meter results. The dry resist film thus produced is laminated onto a cleaned copper circuit board as described in Example 1 and exposed for 20 seconds to the light of the light source employed in Example 1. After developing for 1.5 minutes in the developer described in Example 1, etch resists or electro resists are obtained which are highly resistant to chemical attack.

EXAMPLE 3

A dry resist film weighing 22.9 g per square meter is produced on a polyester film, as described in Example 1, using, however, an equal quantity of the monomer M III described in the following:

After lamination, exposure and development as in Example 1, etch resist or electro resist masks are obtained which are very resistant to chemical attack.

101 g of the biuret group-containing triisocyanate described in Example 2 are reacted, as described in Example 2, with 65 g (0.5 mole) of hydroxy propyl acrylate with the addition of 0.5 g of diethyl cyclohexyl amine and 1.0 g of benzoquinone. A highly viscous monomer (M III) of the structure indicated in the table below is obtained.

$C_{50}H_{86}N_6O_{14}$ (M = 995.2).

Vinyl content: calculated: 8.15; found: 7.6.

EXAMPLE 4

A solution of
- 4.8 parts by weight of the copolymer used in Example 1,
- 0.5 part by weight of triethyleneglycol dimethacrylate,
- 0.2 part by weight of 9-phenyl-acridine,
- 0.06 part by weight of the blue azo dyestuff used in Example 1, and
- 5.6 parts by weight of the monomer M IV described below in
- 8.0 parts by weight of methyl ethyl ketone is whirler-coated onto a polyester film as described in Example 1 and dried. A layer weighing 24.0 grams per square meter is obtained. The dry resist film thus produced is laminated onto a cleaned copper-phenoplast laminate as described in Example 1, exposed for 20 seconds in the xenon copying apparatus used in Example 1, and developed during 30 seconds with a developer composed of equal parts by volume of 0.5 N $Na_2SiO_3 \cdot 9H_2O$ and 0.1N NaOH. Exceptionally flexible and chemically resistant etch or electro resist masks are thus obtained. Alternatively, the developer solution used in Example 1 may be used for development.

The monomer used (N IV) is prepared analogously to Example 2, by reaction of the biuret group-containing triisocyanate with hydroxyethyl acrylate.

Vinyl content: calculated: 8.5; found: 8.0.

EXAMPLE 5

The monomer M IV used in Example 4 may be replaced by the same quantity of the monomer MV described below. In this case also, very flexible non-adhesive dry resist layers without annoying cold flow tendency are obtained by the application of the coating solution to a polyester film as a dry layer weighing around 20 grams per square meter. If the exposure apparatus described in Example 1 is used, an exposure time of 20 seconds is required, and development with the developer used in Example 2 takes 45 seconds. Highly resolved, sharp-edged resist lines are thus obtained whose resistance to chemical attack is excellent.

The monomer is prepared analogously to Example 2, by reaction of the triisocyanate with hydroxyethyl methacrylate.

$C_{50}H_{86}N_6O_{14}$ (M = 995.2)

Propenyl-(2) content: calculated: 12.4; found: 11.0.

EXAMPLE 6

In the above composition, the monomer used in Example 4 also may be replaced by the same quantity of the monomer M III. By the procedure described in Example 1, and with a layer weighing 27 grams per square meter disposed on a polyester film, highly light-sensitive and very flexible dry resist flims are produced which adhere very well to copper and do not display an annoying tackiness or cold flow.

EXAMPLE 7

An offset printing plate is prepared as follows:
A solution of 4.8 parts by weight of the copolymer used in Example 1,
0.2 part by weight of 9-phenyl-acridine,
0.06 part by weight of the blue azo dyestuff used in Example 1,
1.5 parts by weight of triethyleneglycol dimethacrylate, and
5.6 parts by weight of the monomer MI in
8.0 parts by weight of methyl ethyl ketone, and
40.0 parts by weight of ethyleneglycol monoethyl ether is whirler-coated onto electrolytically roughened and anodized aluminum (3 g of oxide per square meter) in such a manner that a layer weighing about 4 grams per square meter results after drying the plate at 100° C. The plate is exposed as described in Example 1, using a negative original combining a 21 (60)step half-tone grey wedge with a density range of 0.05 to 3.05 and density increments of 0.15, and 60-line and 120-line line and dot screen elements. After an exposure time of 50 seconds and a development of 60 seconds in the developer described in Example 1, an offset printing plate ready for printing is obtained which yields very long runs.

EXAMPLE 8

It is also possible to whirler-coat the coating solution of Example 7 in such a manner upon a polyester film that a layer weighing approximately 18 grams per square meter is obtained after drying at 100° C. After lamination and exposure as in Example 1, etch resist or electro resist masks are obtained which are very flexible and resistant to chemical attack.

EXAMPLE 9

A solution of
6.4 parts by weight of the copolymer used in Example 1,
0.2 part by weight of 9-phenyl-acridine,
0.015 part by weight of Michler's ketone,
0.15 part by weight of triethylene glycol dimethacrylate,
0.06 part by weight of the blue azo dyestuff used in Example 1, and
5.6 parts by weight of monomer M VI described below in
10.0 parts by weight of methyl ethyl ketone, and
20.0 parts by weight of ethyleneglycol monoethyl ether is whirler-coated onto a polyester film as described in Example 1 and dried. The dry resist film thus produced is laminated at a temperature of 130° C onto a cleaned copper circuit board, exposed for 20 seconds in the exposure apparatus used in Example 1, and developed for 1.5 minutes with the developer solution employed in Example 1. Flexible etch or electro resist masks are obtained which adhere very well to copper.

In a further experiment, the same solution is whirler-coated onto an electrolytically roughened and anodized aluminum sheet (3 grams of oxide per square meter) and dried at a temperature of 100° C, so that a layer weighing 4.4 grams per square meter results. This layer is then exposed for 50 seconds under the original described in Example 7 and developed for 1 minute with the developer used in Example 1. 7 to 8 fully hardened steps of the step wedge are reproduced. The resulting planographic printing plate may be directly used for offset printing.

The monomer is prepared analogously to Example 2 by reacting 1 mole of the triisocyanate described in Example 2 with 3 moles of acrylic acid in a benzene solution. By this reaction, a carboxylic acid amide group is formed from an isocyanate group and a carboxyl group, carbon dioxide being split-off.

$C_{38}H_{68}N_6O_5$ (M = 689.0)

Vinyl content: calculated: 11.8; found: 10.4.

EXAMPLE 10

A solution of
7.0 parts by weight of a copolymer of 100 parts by weight of 2-ethyl-hexyl methacrylate, 7.5 parts by weight of acrylonitrile, and 45 parts by weight of methacrylic acid,
2.8 parts by weight of monomer M VI,
2.8 parts by weight of a monomer prepared by reaction of 1 mole of 2,2,4-trimethyl-hexamethylene diisocyanate and 2 moles of hydroxy ethyl methacrylate (see German Offenlegungsschrift No. 2,064,079, Example 1)
0.2 part by weight of 9-phenyl-acridine, and
0.06 part by weight of the blue azo dyestuff used in Example 1, in
14.0 parts by weight of methyl ethyl ketone, and
20.0 parts by weight of ethyleneglycol monoethyl ether is whirler-coated as described in Example 1 onto a polyester film so that a dry resist film weighing 23 grams per square meter is obtained after drying. After lamination to a cleaned copper circuit board at 120° C and a 30 second image-wise exposure under a transparent negative original, using the exposure apparatus described in Example 1, the plate is developed by a 60 seconds treatment with a 0.4 percent by weight sodium carbonate solution in a spray developing apparatus of type "Processor A 24" marketed by DuPont. The circuit board then may be either directly etched, or first electroplated and then etched. The resist used in this example is very resistant to acid etching baths and acid electroplating baths. After removal of the etch resist by immersion in a 5% by weight NaOH solution at 45° C, circuit boards with very sharp edges result.

EXAMPLE 11

A solution of
4.8 parts by weight of the copolymer described in Example 1,
0.2 part by weight of 9-phenyl-acridine,
0.5 part by weight of triethylene glycol dimethacrylate,
0.06 part by weight of the blue azo dyestuff used in Example 1, and
5.6 parts by weight of the monomer M VII describe below, in
8.0 parts by weight of methyl ethyl ketone, and
35.0 parts by weight of ethylene glycol monoethyl ether is whirler-coated as in Example 1 upon a polyester film so that a layer weighing 22.6 grams per square meter results after drying, which is then laminated onto a copper circuit board, exposed, and developed for 1.5 minutes in the developer solution used in Example 1. The resulting dry resist film is of excellent flexibility and good resistance to the usual acid etches and electroplating baths.

The monomer M VII used in this example is prepared as follows:

101 g of the triisocyanate described in Example 2 are dissolved in 500 ml of anhydrous benzene, using a carefully dried three-necked flask provided with a reflux condenser, a drying tube, and a stirrer. After adding 170 g of pentaerythritol trimethacrylate, 2.5 g of freshly purified benzoquinone, and 1.2 g of diethyl cyclohexyl amine, the mixture is boiled for 4 hours with reflux. Then the solvent is removed by vacuum distillation at 50° C. A highly viscous product is obtained.
$C_{83}H_{128}N_6O_{26}$ (M = 1625.9)

N content: calculated: 5.17; found: 5.20. Propenyl-(2) content: calculated: 22.8; found: 18.6.

EXAMPLE 12

A solution of
4.8 parts by weight of the copolymer used in Example 1,
0.2 part by weight of 9-phenyl-acridine,
0.5 part by weight of triethylene glycol dimethacrylate,
0.015 part by weight of Michler's ketone,
0.06 part by weight of the blue azo dyestuff used in Example 1, and
5.6 parts by weight of monomer M VIII below
40.0 parts by volume of ethylene glycol monoethyl ether, and
8.0 parts by volume of methyl ethyl ketone,
is whirler-coated onto a polyester film as described in Example 1 and dried. The resulting dry resist film, which weighs 22 grams per square meter, is laminated at 120° C onto a cleaned copper circuit board and exposed for 20 seconds under a negative original of the desired wiring diagram, using the exposure apparatus mentioned in Example 1. The exposed circuit board is developed by moving it for 1.5 minutes in the developer described in Example 1, followed by slight rubbing, and finally rinsing with water. An etch resist or electro resist mask results which has a very good adhesion and is very resistant to chemical attack.

The monomer used in this example is prepared by reacting the triisocyanate described in Example 2 with pentaerythritol triacrylate, analogously to the method described in Example 11.
$C_{74}H_{110}N_6O_{26}$ (M = 1500).

EXAMPLE 13

The coating solution used in Example 12 is applied to an electrolytically roughened and anodized aluminum plate (3 g of oxide per square meter) and dried so that the dried layer has a weight of 3.2 g per square meter. The resulting photopolymer layer is then covered with an approximately 5 μ thick polyvinyl alcohol film by pouring a 10% aqueous polyvinyl alcohol solution over it. In the exposure apparatus used in Example 1, the plate is exposed for 30 seconds under a negative transparent original combining a line screen and a step wedge and then developed for 1.5 minutes with a 3 percent by weight solution of $Na_2SiO_3 \cdot 9H_2O$. An offset printing plate is thus obtained which is ready for printing and yields very long runs.

EXAMPLE 14

A solution of
4.8 parts by weight of the copolymer used in Example 1,
0.2 part by weight of 9-phenyl-acridine,
0.15 part by weight of triethyleneglycol dimethacrylate,
0.015 part by weight of Michler's ketone,
0.06 part by weight of the blue azo dyestuff used in Example 1, and
5.6 parts by weight of the monomer M IX described below, in
30.0 parts by volume of ethyleneglycol monoethyl ether, and
8.0 parts by volume of methyl ethyl ketone,
is whirler-coated onto a polyester film as described in Example 1 and dried. The dry resist film weighing 20 grams per square meter which is thus obtained is laminated to a cleaned copper circuit board and exposed for 30 seconds in the exposure apparatus employed in Example 1 under a transparent negative original showing the tracks of the desired printed circuit. The plate is developed for 1.5 minutes with a developer composed of equal parts of a 0.5N solution of $Na_2SiO_3 \cdot 9H_2O$ and a 0.1N solution of NaOH and then used as an electro resist mask in the following process steps:

a. First, the circuit board is electroplated in an acid copper bath, e.g. the "Feinkorn-Kupferplasticbad MS" marketed by Messrs. Schlötter, Geislingen/Steige, Germany; current density: $2A/dm^2$; bath temperature: 20° C; duration: 30 minutes.

b. Then the circuit board is treated for 5 minutes with a nickel bath of Messrs. Schlötter, type "Norma;" current density: $4A/dm^2$; bath temperature: 50° C; pH value: 3.5 to 4.5.

c. Finally, the plate is electroplated in a gold bath marketed by Messrs. Blasberg, Solingen, Germany, type "Antronex N;" current density: $0.6A/dm^2$; bath temperature: 20° C; pH value: 3.5 to 4.0; duration: 15 minutes.

The exposed and developed layer shows a very good resistance during process steps a) and b) and also c). The circuit board is then decoated by treatment with a 4 percent by weight NaOH solution at 40° C. By etching the bared copper layer in one of the conventional etching media, high quality printed circuits are produced which are particularly distinguished by the vertical structure and sharp edges of the conductor tracks.

The photomonomer M IX used in this example is synthesized as follows:

222 g isophoron diisocyanate are dissolved in 500 ml of anhydrous benzene in a carefully dried three-necked flask of a capacity of 2 liters which is equipped with a stirrer, a reflux condenser, and a dropping funnel, and, after adding 70 g of triethylene glycol and 1.5 g of diethyl cyclohexyl amine, the mixture is boiled for three hours with reflux. 130 g of hydroxy ethyl methacrylate stabilized by the addition of 1.5 g of freshly purified benzoquinone are then added to the reaction mixture through the dropping funnel and the mixture is again boiled for 3 hours with reflux. Then, it is freed from benzene in a rotary vacuum evaporator. A reddish-brown colored, highly viscous product is obtained which is substantially composed of a component of the structural formula M IX in the table below.
$C_{42}H_{76}N_4O_{10}$ (M = 791).

EXAMPLE 15

A solution of
5.3 parts by weight of the copolymer used in Example 1,
0.5 part by weight of triethyleneglycol dimethacrylate,
5.6 parts by weight of the monomer M IX
0.2 part by weight of 9-phenyl-acridine, and 0.06 part by weight of the blue azo dyestuff used in Example 1, in
12.0 parts by weight of methyl ethyl ketone, and
20.0 parts by weight of ethyleneglycol monoethyl ether is whirler-coated onto a polyester film as described in Example 1 so that a layer weighing 24.4 grams per square meter is produced after drying. The resulting dry resist film is laminated at 120° C to a cleaned copper circuit board and exposed and developed as described in Example 14. After developing for 90 seconds in a 0.4 percent by weight sodium carbonate solution, sharp-edged and highly resolved resist lines are obtained. The resist is very resistant to the chemical attack of the conventional acid etching and electroplating baths.

TABLE

MI:
$$\begin{array}{l}HN-C_6H_{12}-NH-\overset{O}{\underset{\|}{C}}-O-C_2H_4-O-\overset{O}{\underset{\|}{C}}-\overset{CH_3}{\underset{|}{C}}=CH_2\\ O=C\\ \phantom{O=}|\\ \phantom{O=}N-C_6H_{12}-NH-\overset{O}{\underset{\|}{C}}-O-C_2H_4-O-\overset{O}{\underset{\|}{C}}-\overset{CH_3}{\underset{|}{C}}=CH_2\\ O=C\\ \phantom{O=}|\\ HN-C_6H_{12}-NH-\overset{O}{\underset{\|}{C}}-O-C_2H_4-O-\overset{O}{\underset{\|}{C}}-\overset{CH_3}{\underset{|}{C}}=CH_2\end{array}$$

MII:
$$\begin{array}{l}HN-C_9H_{18}-NH-\overset{O}{\underset{\|}{C}}-O-C_3H_6-O-\overset{O}{\underset{\|}{C}}-\overset{CH_3}{\underset{|}{C}}=CH_2\\ O=C\\ \phantom{O=}|\\ \phantom{O=}N-C_9H_{18}-NH-\overset{O}{\underset{\|}{C}}-O-C_3H_6-O-\overset{O}{\underset{\|}{C}}-\overset{CH_3}{\underset{|}{C}}=CH_2\\ O=C\\ \phantom{O=}|\\ HN-C_9H_{18}-NH-\overset{O}{\underset{\|}{C}}-O-C_3H_6-O-\overset{O}{\underset{\|}{C}}-\overset{CH_3}{\underset{|}{C}}=CH_2\end{array}$$

MIII:
$$\begin{array}{l}HN-C_9H_{18}-NH-\overset{O}{\underset{\|}{C}}-O-C_3H_6-O-\overset{O}{\underset{\|}{C}}-CH=CH_2\\ O=C\\ \phantom{O=}|\\ \phantom{O=}N-C_9H_{18}-NH-\overset{O}{\underset{\|}{C}}-O-C_3H_6-O-\overset{O}{\underset{\|}{C}}-CH=CH_2\\ O=C\\ \phantom{O=}|\\ HN-C_9H_{18}-NH-\overset{O}{\underset{\|}{C}}-O-C_3H_6-O-\overset{O}{\underset{\|}{C}}-CH=CH_2\end{array}$$

MIV:
$$\begin{array}{l}HN-C_9H_{18}-NH-\overset{O}{\underset{\|}{C}}-O-C_2H_4-O-\overset{O}{\underset{\|}{C}}-CH=CH_2\\ O=C\\ \phantom{O=}|\\ \phantom{O=}N-C_9H_{18}-NH-\overset{O}{\underset{\|}{C}}-O-C_2H_4-O-\overset{O}{\underset{\|}{C}}-CH=CH_2\\ O=C\\ \phantom{O=}|\\ HN-C_9H_{18}-NH-\overset{O}{\underset{\|}{C}}-O-C_2H_4-O-\overset{O}{\underset{\|}{C}}-CH=CH_2\end{array}$$

MV:
$$\begin{array}{l}HN-C_9H_{18}-NH-\overset{O}{\underset{\|}{C}}-O-C_2H_4-O-\overset{O}{\underset{\|}{C}}-\overset{CH_3}{\underset{|}{C}}=CH_2\\ O=C\\ \phantom{O=}|\\ \phantom{O=}N-C_9H_{18}-NH-\overset{O}{\underset{\|}{C}}-O-C_2H_4-O-\overset{O}{\underset{\|}{C}}-\overset{CH_3}{\underset{|}{C}}=CH_2\\ O=C\\ \phantom{O=}|\\ HN-C_9H_{18}-NH-\overset{O}{\underset{\|}{C}}-O-C_2H_4-O-\overset{O}{\underset{\|}{C}}-\overset{CH_3}{\underset{|}{C}}=CH_2\end{array}$$

TABLE-continued
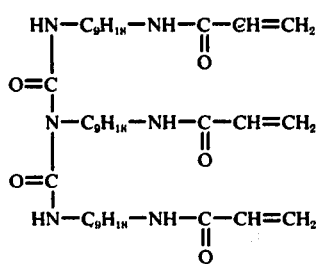 MVI
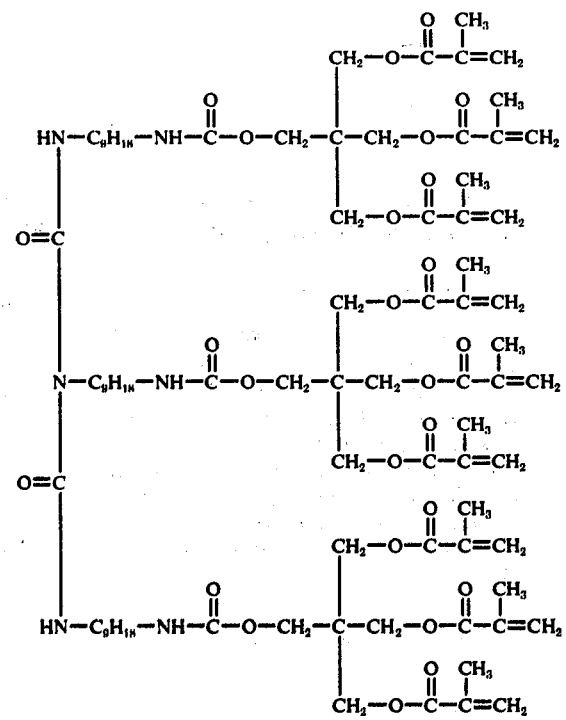 MVII
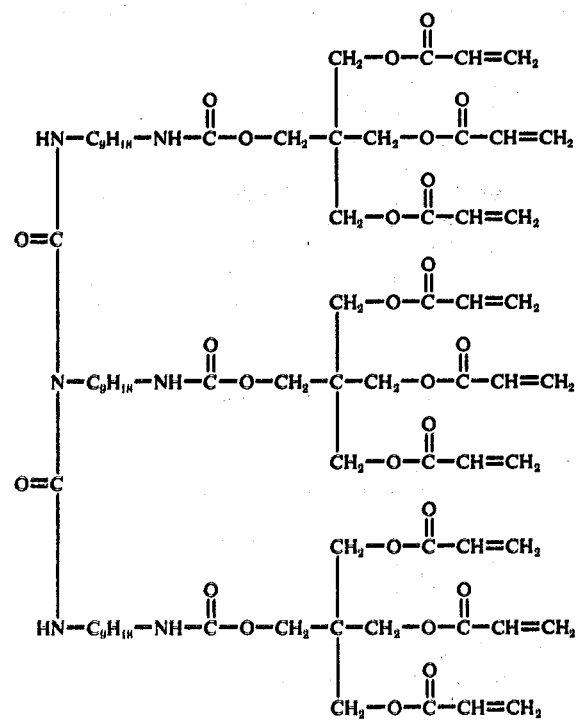 MVIII

TABLE-continued

[Complex chemical structure diagram labeled "MIX" showing a molecule with multiple cyclohexane rings bearing CH₃ groups, connected via NH-C(=O)-O-CH₂-CH₂-O-C(=O)-C(CH₃)=CH₂ urethane/methacrylate linkages, with a central nitrogen branching to CH₂-NH-C(=O)-O-(-CH₂-CH₂-O-)₂-CH₂-CH₂-O-C(=O)-NH-CH₂ group]

It will be obvious to those skilled in the art that many modifications may be made within the scope of the present invention without departing from the spirit thereof, and the invention includes all such modifications.

What is claimed is:

1. A photopolymerizable copying composition comprising at least one binder, at least one photoinitiator, and at least one polymerizable acid amide group-containing acrylic acid derivative or alkyl acrylic acid derivative which is not volatile at 100° C and contains at least three polymerizable unsaturated groups in the molecule, the polymerizable compound containing at least one compound of the following general formula $$A(-X-NH-CO-G)_p$$

wherein:

A stands for $-N(-CO-NH-)_2$

G stands for $$-\underset{\underset{C_nH_{2n+1}}{|}}{C}=CH_2, \quad -O-CH_2-C_mH_{2m}-O-CO-\underset{\underset{C_nH_{2n+1}}{|}}{C}=CH_2,$$

or $$-O(-CH_2-CH_2-O-)_k-CH_2-\underset{\underset{R_3}{|}}{\overset{\overset{R_1}{|}}{C}}-R_2,$$

wherein
$n$ is 0, 1, or 2,
$m$ is a whole number from 1 to 11,
$k$ is 0 or a whole number from 1 to 4,
$R_1$ is alkyl with 1 to 3 carbon atoms, or $-R_4$ or $-CH_2-R_4$
$R_4$ and $R_3$, which may be the same or different, are $-H$, $-CH_3$, or $-CH_2R_4$, and
$R_4$ is $$-O-CO-\underset{\underset{C_nH_{2n+1}}{|}}{C}=CH_2$$

and is present at least one of the groups $R_1$, $R_2$, and $R_3$,

X stands for a saturated or unsaturated bi-valent hydrocarbon group with 2 to 12 carbon atoms, and $p$ is a whole number from 2 to 4.

2. A copying composition according to claim 1 wherein the polymerizable compound has a molecular weight between 300 and 10,000.

3. A copying composition according to claim 1 wherein the polymerizable compound have a viscosity between 5 and 10,000 poises at 50° C.

4. A copying composition according to claim 3 wherein the polymerizable compound has a viscosity between 10 and 2,500 poises at 50° C.

5. A copying composition according to claim 1 wherein A stands for $$-NH-CO-\underset{|}{N}-CO-NH-.$$

6. A copying composition according to claim 1 wherein $n$ is 1.

7. A copying composition according to claim 1 wherein X is a saturated aliphatic group.

8. A copying composition according to claim 1 wherein the polymerizable compound contains at least two urethane groups.

9. A copying composition according to claim 1 wherein at least one of the groups G in the molecule has at least one oxygen atom.

10. A copying composition according to claim 1 wherein the polymerizable compound has the formula $$\begin{array}{l}HN-C_6H_{12}-NH-\overset{O}{\overset{\|}{C}}-O-C_2H_4-O-\overset{O}{\overset{\|}{\underset{}{C}}}-\overset{CH_3}{\underset{|}{C}}=CH_2\\O=C\\|\\N-C_6H_{12}-NH-\overset{O}{\overset{\|}{C}}-O-C_2H_4-O-\overset{O}{\overset{\|}{\underset{}{C}}}-\overset{CH_3}{\underset{|}{C}}=CH_2\\O=C\\|\\HN-C_6H_{12}-NH=\overset{O}{\overset{\|}{C}}-O-C_2H_4-O-\overset{O}{\overset{\|}{\underset{}{C}}}-\overset{CH_3}{\underset{|}{C}}=CH_2\end{array}$$

11. A copying composition according to claim 1 wherein the polymerizable compound has the formula

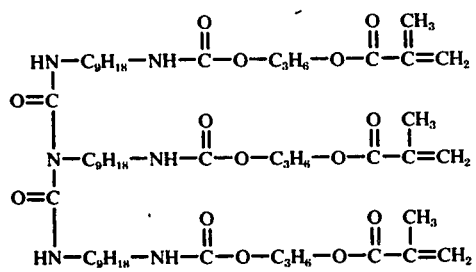
12. A copying composition according to claim 1 wherein the polymerizable compound has the formula
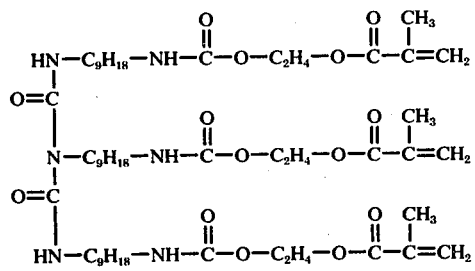
* * * * *